United States Patent
Obara et al.

(10) Patent No.: US 8,013,299 B2
(45) Date of Patent: Sep. 6, 2011

(54) REVIEW METHOD AND REVIEW DEVICE

(75) Inventors: Kenji Obara, Kawasaki (JP); Takehiro Hirai, Ushiku (JP); Kohei Yamaguchi, Dublin, CA (US); Naoma Ban, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 195 days.

(21) Appl. No.: 12/366,179

(22) Filed: Feb. 5, 2009

(65) Prior Publication Data

US 2009/0206259 A1 Aug. 20, 2009

(30) Foreign Application Priority Data

Feb. 18, 2008 (JP) ................ 2008-035444

(51) Int. Cl.
*G01N 23/00* (2006.01)
(52) U.S. Cl. ...................... 250/307; 250/311
(58) Field of Classification Search ................ 250/306, 250/307, 310, 311
See application file for complete search history.

(56) References Cited

U.S. PATENT DOCUMENTS

| | | | |
|---|---|---|---|
| 5,801,965 A | 9/1998 | Takagi et al. | |
| 6,756,589 B1 | 6/2004 | Obara et al. | |
| 7,075,077 B2 * | 7/2006 | Okuda et al. | 250/310 |
| 7,655,907 B2 * | 2/2010 | Tanimoto et al. | 250/310 |
| 2006/0043294 A1 * | 3/2006 | Yamaguchi et al. | 250/310 |

FOREIGN PATENT DOCUMENTS

| | | |
|---|---|---|
| JP | 07-201946 | 8/1995 |
| JP | 2000-030652 | 1/2000 |
| JP | 2005-285746 | 10/2005 |

* cited by examiner

*Primary Examiner* — Jack Berman
*Assistant Examiner* — David E Smith
(74) *Attorney, Agent, or Firm* — McDermott Will & Emery LLP

(57) ABSTRACT

A defect review method and a defect review device using an electron microscope, reduce the number of user processes necessary to set automatic focal adjustment of an electron beam to provide easier sample observation.

The review method comprises the steps of: performing focal adjustment for a plurality of coordinate positions pre-registered on the coordinate on an object under observation; creating a criterion for focal adjustment based on a focal position at each of the plurality of coordinate positions; setting a focal probe range based on a deviation between the criterion and the focal position; and determining an automatic focal adjustment range for defect detection on the object under observation based on the set focal probe range.

6 Claims, 4 Drawing Sheets

FIG. 8

```
AF SETUP

Range    ☐ Narrow    ☐ Normal    ☐ Wide    ■ Auto

Mode     ☐ Fine      ☐ Normal    ■ Fast
```

REVIEW METHOD AND REVIEW DEVICE

BACKGROUND OF THE INVENTION

1. Field of the Invention

The present invention relates to a review method and a review device for reviewing a defect produced in the thin-film device manufacturing process of a semiconductor electronic circuit substrate, a liquid crystal display substrate, and the like by use of a magnified image pickup device such as a scanning electron microscope.

2. Description of the Related Art

A thin-film device such as a semiconductor, a liquid crystal display, a hard disk magnetic head, etc. is manufactured through a number of processes.

Pattern processing for these devices may include several hundreds of processes. If an appearance failure such as a foreign substance, circuit pattern disconnection, etc. occurs on a thin-film device because of a defective manufacture condition or a failure of a processing apparatus, the probability that a defect occurs in a product increases resulting in a decreased yield. Therefore, it is important to locate a defective apparatus and take pertinent measures in order to maintain and improve the yield. Therefore, in each of main processes, the foreign substance inspection, visual inspection, and other inspections are performed to check whether processing is normally performed. In this case, since it is impossible to inspect all processed substrates in each process because of limited time and labor, these inspections are generally performed for each lot, for each processed substrate, or for processed substrates sampled in a combination, thereof on a process series basis. Here, a processed substrate means a minimum unit subjected to product processing, for example, a single wafer in the case of semiconductor.

When an inspection device performs the foreign substance inspection, it scans the wafer surface with laser to detect whether or not dispersion light is present, thus obtaining the position and number of foreign substances. Further, when the inspection device performs the defect inspection for detecting both a foreign substance and a pattern failure, it captures images of a circuit pattern of the wafer by use of, for example, an optical magnified image pickup device, and compares the captured images with images of a neighboring area having the same pattern, thus obtaining information on the position and number of singular points. Here, a "singular point" refers to an output point at which a failure is detected through inspections performed by the inspection device. Hereinafter, a foreign substance and an appearance failure are collectively referred to as defect.

The judgment of an apparatus failure is performed in many cases by using the number and concentration of defects detected by the inspection device as control indices. If the number or concentration of defects exceeds a preset reference value, the inspection device is judged to be defective. In this case, a review device employing an optical microscope or a scanning electron microscope (hereinafter referred to as SEM) takes magnified images of a defect based on the defect coordinates information detected by the inspection device to obtain detailed information such as the size, profile, texture, etc. of the defect; and performs element analysis, cross-sectional observation, and other in-depth inspections to locate a defective apparatus and obtain the details of the defect. Then, based on the results of the inspections, the review device takes measures for relevant apparatuses and processes to prevent the decrease in the manufacture yield. In recent years, with the increase in the fineness of a pattern under inspection and needs for detecting a fine foreign substance, the importance of the role played by the SEM review devices is also increasing.

An SEM review device has been developed, the device having a function to automatically take magnified images of a foreign substance and a defect (Automatic Defect Review; hereinafter referred to as ADR) based on inspection data from a foreign substance inspection device or a visual inspection device to perform review processing automatically and efficiently. Such a device is disclosed in JP-A-2000-30652 (corresponding to U.S. Pat. No. 6,756,589). Further, a technique for automatically classifying obtained images (Automatic Defect Classification; hereinafter referred to as ADC) according to a specific rule is disclosed in JP-A-7-201946 (corresponding to U.S. Pat. No. 5,801,965).

When magnified images of the defect are taken by the SEM review device by use of defect data of the inspection device, focal position adjustment is performed, for example, as follows:

(1). Obtain a plurality of images having different focal positions.
(2) Calculate the focal measure which is a quantitative index of the degree of in-focus state for each of the obtained images.
(3) Estimate a focal position where the focal measure is maximized when the focal measure is defined so as to be larger at positions closer to the in-focus position, or minimized when the focal measure is defined so as to be smaller at positions closer to the in-focus position.
(4) Set the focal position estimated in (3) above.

An example of focal measure is a quantity obtained by applying a differential operator to the images and then integrating the absolute value of the output. In this case, since the output value of the differential operator is larger at positions closer to the in-focus position, the value of the focal measure also is larger at positions closer to the in-focus position. When focal position adjustment is made, it is generally necessary to set a focal probe range for detecting an in-focus position.

Depending on the material or structure of an object under observation, radiation of an electron beam may cause a charging phenomenon on the surface of the object under observation. Therefore, when the electron beam is radiated again, the electron beam may be affected by the charged surface resulting in a deviation of the in-focus position. Further, when there is a large variation in the height of the object under observation, focal adjustment of an electron beam having a shallow focal depth is difficult. When the in-focus position is deviated by such a cause and the in-focus position is not included in the focal probe range, accurate estimation of the in-focus position becomes difficult. Therefore, from the viewpoint of the stability in locating an in-focus position, it is desirable that the in-focus position probe range be as wide as possible. On the other hand, from the viewpoint of reducing the focal adjustment time, it is desirable that the in-focus position probe range be as narrow as possible. It has been necessary for the user to take these situations into consideration when an in-focus position probe range is set, and therefore repeat this trial until an appropriate setup is found.

As a method for narrowing the in-focus position probe range, a technique is disclosed in JP-A-2005-285746 (corresponding to U.S. Pat. No. 7,075,077) for performing focal adjustment at a plurality of positions on the object under observation in advance, estimating a curved surface on which an image is in focus from the in-focus position, and utilizing a focal map using the curved surface as a reference point for focal probe. However, JP-A-2005-285746 does not disclose the in-focus position probe range.

SUMMARY OF THE INVENTION

An object of the present invention is to provide a review method and a review device that can reduce the number of user processes necessary to set an in-focus range of an electron beam to provide easier sample observation regardless of operator's skill.

In order to attain the above-mentioned object, an embodiment of the present invention performs the steps of: performing focal adjustment for a plurality of coordinate positions pre-registered on the coordinates of the object under observation; creating a criterion for focal adjustment based on the focal position at each of the plurality of coordinate positions; setting a focal probe range based on a deviation between the criterion and the above-mentioned focal position; and determining an automatic focal adjustment range for defect detection on the object under observation based on the set focal probe range.

In accordance with the present invention, the number of user processes necessary for setting an in-focus range can be reduced to provide easier sample observation.

BRIEF DESCRIPTION OF THE DRAWINGS

Other objects and advantages of the invention will become apparent from the following description of embodiments with reference to the accompanying drawings in which:

FIG. 8 is a diagram showing an example setup screen for setting parameters for automatic focal adjustment.

DESCRIPTION OF THE PREFERRED EMBODIMENTS

Figure 1:
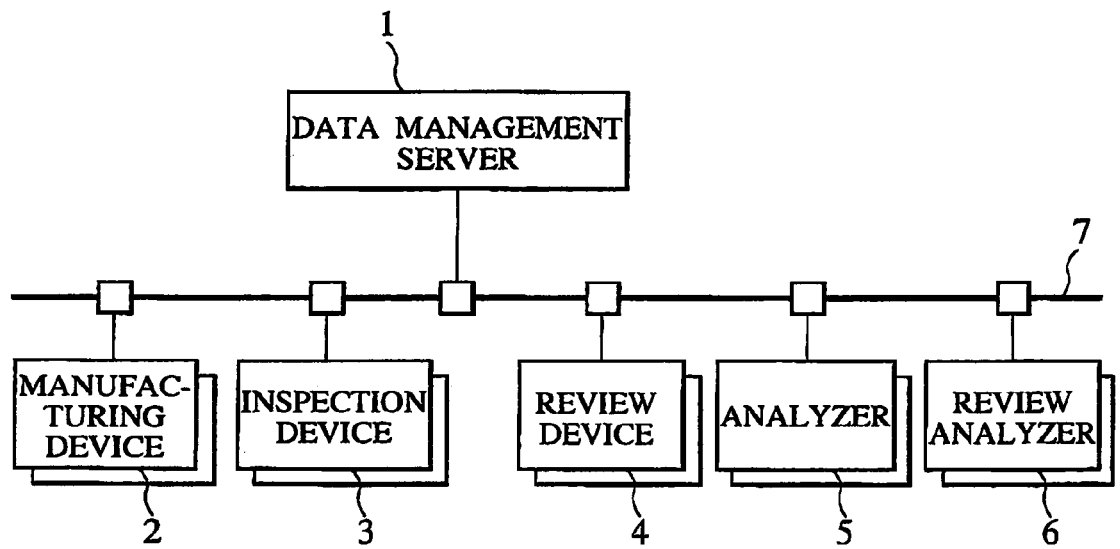
FIG. 1 is a system configuration diagram showing connections of apparatuses in part of a semiconductor wafer manufacture line.

An embodiment of the present invention will be explained below with reference to the accompanying drawings, exemplifying a case where a semiconductor wafer is observed by a defect review device. FIG. 1 is a system configuration diagram showing connections of apparatuses in part of a semiconductor wafer manufacture line. The manufacture line of the semiconductor wafer is composed of a semiconductor wafer manufacturing device 2, an inspection device 3, a review device 4, an analyzer 5, a review analyzer 6, and a data management server 1 which are mutually connected through a network 7, as shown in FIG. 1.

The manufacturing device 2 is an exposure device, an etching device, or other devices used for manufacturing a semiconductor wafer. The inspection device 3 inspects whether or not a defect occurs and whether or not there is a foreign substance on the semiconductor wafer processed by the manufacturing device 2 to detect the position of a defect and a foreign substance. One known detection method deflects a light beam spot on the semiconductor wafer to scan the wafer surface to locate a defect position based on the degree of random reflection from the beam spot. Another known detection method obtains images of a formed pattern through each of two chips and then compares these images to recognize a mismatched portion to detect a defect position. Inspection information such as the coordinate of the defect detected by the inspection device 3 is sent to the review device 4 through the network 7.

The review device 4 observes the defect based on the inspection information received from the inspection device 3. The review device 4 moves a stage on which the semiconductor wafer is mounted, and performs positioning of the target defect on the semiconductor wafer based on the defect position information output from the inspection device 3 to observe the defect. Observation is performed through imaging by use of an optical microscope or an electron microscope. The present embodiment uses an SEM. The analyzer 5 performs element analysis based on the EDX for X-ray detection and the Auger electron spectroscopy. The Auger electron spectroscopy is a method for detecting and analyzing Auger electrons emitted from an object under observation when an electron beam is radiated onto the object under observation. A single unit of the review analyzer 6 can perform both defect observation and element analysis. The analyzer 5 or the review analyzer 6 performs positioning of the defect based on the defect position information received from the inspection device 3 to enable defect review and analysis.

Although FIG. 1 shows that each apparatus is provided with a different function, it is also possible that a single apparatus is provided with various functions. For example, it is possible to add the function of the inspection device 3 to the manufacturing device 2, or integrate the inspection device 3 and the review device 4 into a single apparatus having the functions of both.

The data management server 1 manages data obtained by the inspection device 3, the review device 4, the analyzer 5, and the review analyzer 6. The review device 4 and the analyzer 5 can obtain information such as the defect position coordinates output from the inspection device 3 through the data management server 1. It is also possible that the review device 4 is provided with whole or part of the function of the data management server 1.

Although these apparatuses are connected through the network 7 in FIG. 1, it is not necessary to connect these apparatuses through the network 7, that is, these apparatuses may be connected so as to allow data exchange therebetween not through the network 7.

Figure 2:
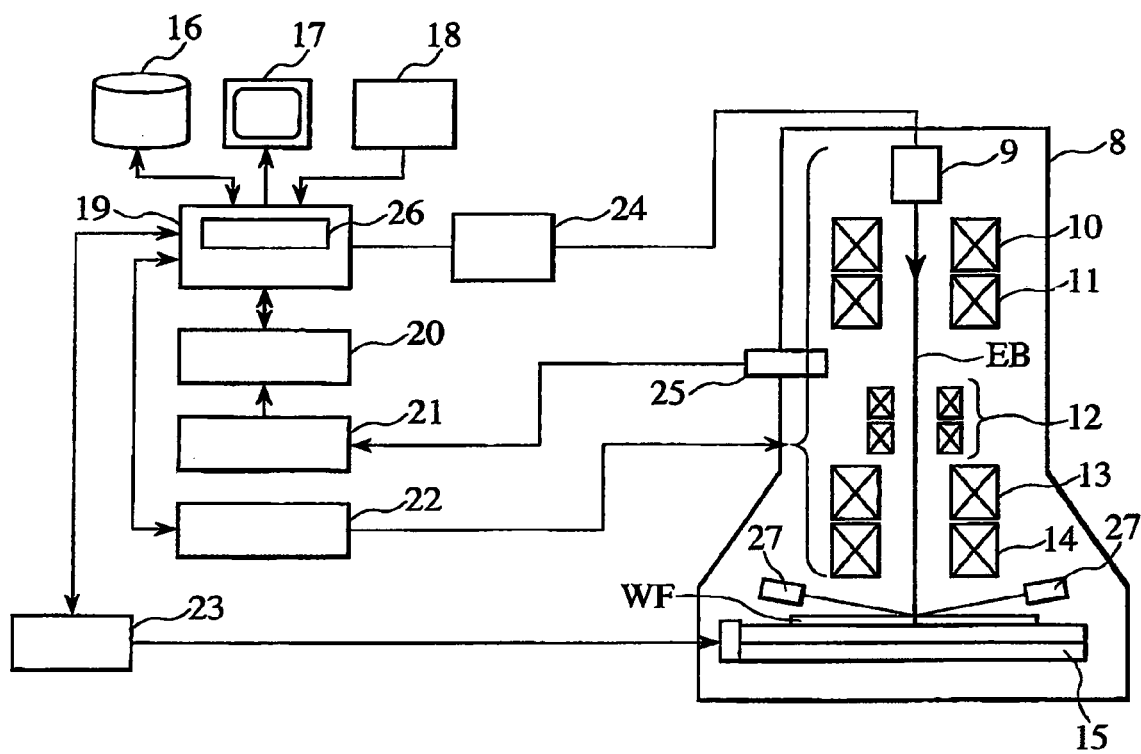
FIG. 2 is a longitudinal sectional view showing the schematic configuration of an SEM review device.

FIG. 2 is a longitudinal sectional view showing the schematic configuration of the SEM review device. A semiconductor wafer WF to be reviewed is mounted on an XYZ stage 15. The XYZ stage 15 is controlled so as to move in the X and Y directions by a stage control unit 23 based on a control signal sent from a total control unit 19 having a microprocessor. The XYZ stage 15 can also be vertically controlled. An SEM-based image pickup device 8 takes magnified images of the semiconductor wafer WF fixed to the XYZ stage 15.

A constant voltage controlled by a high-voltage stabilized power supply 24 is applied to an electron source 9 which generates an electron beam EB of the image pickup device 8. The electron beam EB emitted from the electron source 9 is converged to a thinner beam by a first condenser electron lens 10, a second condenser electron lens 11, a first objective electron lens 13, and a second objective electron lens 14. At the same time, the electron beam EB is deflected to scan the semiconductor wafer WF by means of a deflection scanning coil 12. When the electron beam EB is radiated onto the semiconductor wafer WF under measurement, a secondary signal, such as secondary electrons and reflective electrons, is generated from the semiconductor wafer WF. The secondary signal is detected by a signal detector 25 and then processed by an A/D converter 21 which converts an analog signal to a digital form. An image calculation unit 20 having a microprocessor performs image processing of the semiconductor wafer WF such as SEM image generation and defect detection processing, and a display unit 17 displays the images through the total control unit 19. A storage unit 16 is connected to the total control unit 19 to store SEM images and accompanying data. The user using the review device inputs defect observation conditions and other input items through an input unit 18. The total control unit 19 controls each of the above-mentioned apparatuses of the image pickup device 8 through an electron optics system control unit 22 based on the input items and a prestored control program.

Defect coordinate data of the semiconductor wafer WF is sent from the inspection device 3 shown in FIG. 1 to the total control unit 19 through the network 7. Based on the received defect coordinate data, the total control unit 19 sends a stage movement command to the stage control unit 23 to move the XYZ stage 15 so that the target defect comes within the field of view of the image pickup device 8.

Since the focal depth of the SEM is small, it is important to measure the height position of the defect and control the focus of the electron beam EB in order to take images of the defect. The image pickup device 8 includes a surface height detection unit 27 which detects the height of the observation field of view of the SEM. The energizing intensity of the first objective electron lens 13 and the second objective electron lens 14 is controlled in relation to the output from the surface height detection unit 27 so that the focal position of the electron beam EB suits the height of the observation field of view. In focal adjustment of the electron beam EB, the first condenser electron lens 10 and the second condenser electron lens 11 may be controlled as required. Since this focal adjustment is performed before taking SEM images, it is possible to cancel variation in height due to the observation position by the distorted profile of the semiconductor wafer WF or the like. Since the measurement accuracy of the height position of the observation field of view by the surface height detection unit 27 is coarse in comparison with the focal depth of the electron beam EB, the result of focal adjustment is checked after taking SEM images and, if necessary, the focal position of the electron beam EB is changed. An in-focus position analysis and calculation unit 26 included in the total control unit 19 performs analysis for focal adjustment, and the results of the analysis are displayed on the display unit 17. Although the in-focus position analysis and calculation unit 26 is included in the total control unit 19 of the review device 4 in the present embodiment, it is also possible to provide the in-focus position analysis and calculation unit 26 as a function of the data management server 1.

Figure 3:
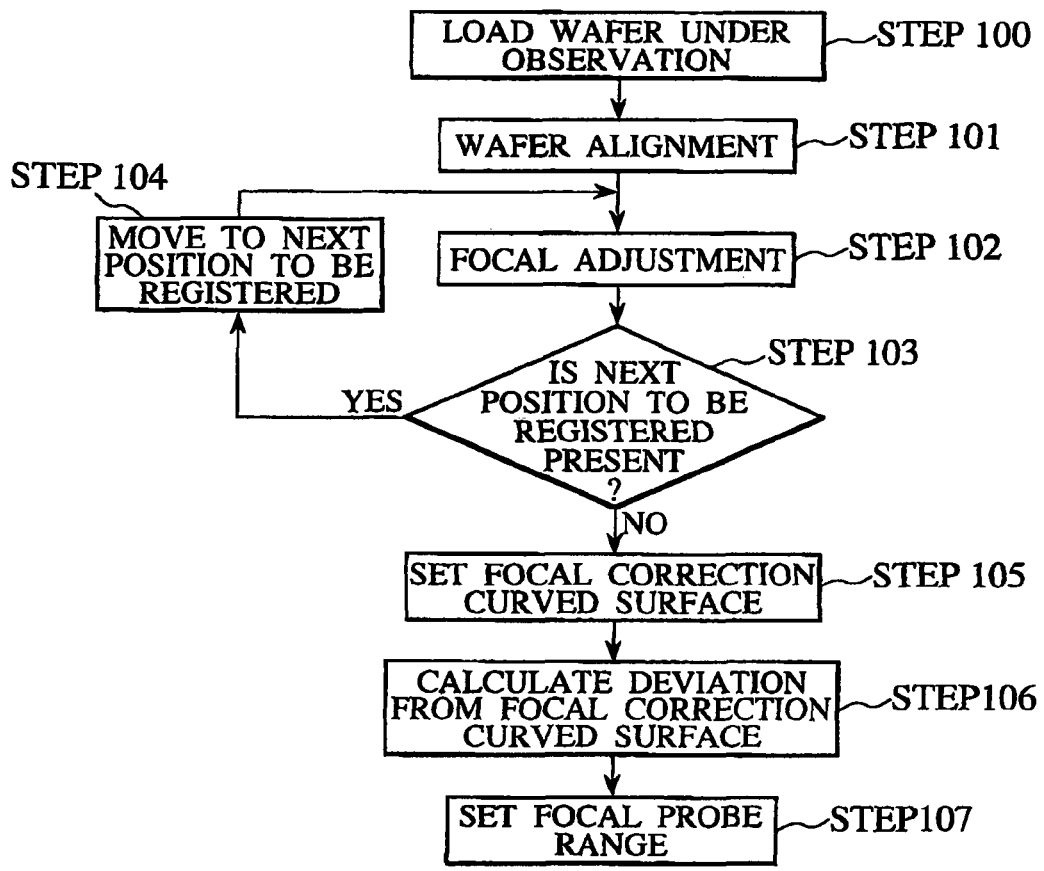
FIG. 3 is a flow chart explaining a procedure for setting a focal probe range.

FIG. 3 is a flow chart explaining a procedure for setting a focal probe range by the in-focus position analysis and calculation unit 26. The in-focus position analysis and calculation unit 26 loads the semiconductor wafer under observation into the image pickup device 8 (Step 100), and performs wafer alignment to correct an error between the coordinate system of the SEM and that of the semiconductor wafer (Step 101). In wafer alignment, for example, the user specifies a characteristic pattern at a plurality of known positions on the semiconductor wafer, the characteristic pattern not being similar to any other patterns in the vicinity of each of the plurality of positions. Then, this pattern is imaged to determine the coordinate of the target pattern on the SEM from the position of the XYZ stage 15, and obtains an error between the coordinate system of the SEM and that of the semiconductor wafer sent from the inspection device 3. In accordance with this procedure, a rotational deviation of the coordinate produced when the semiconductor wafer is loaded into the image pickup device 8 can also be corrected.

Then, the in-focus position analysis and calculation unit 26 performs focal adjustment of the electron beam EB at one of predetermined coordinate positions, and obtains the data at this coordinate position and the data at the in-focus position (Step 102). The coordinate position at which focal adjustment is performed is pre-registered by the control program executed by the total control unit 19, or registered from the input unit 18 shown in FIG. 1 by the user.

Figure 4:
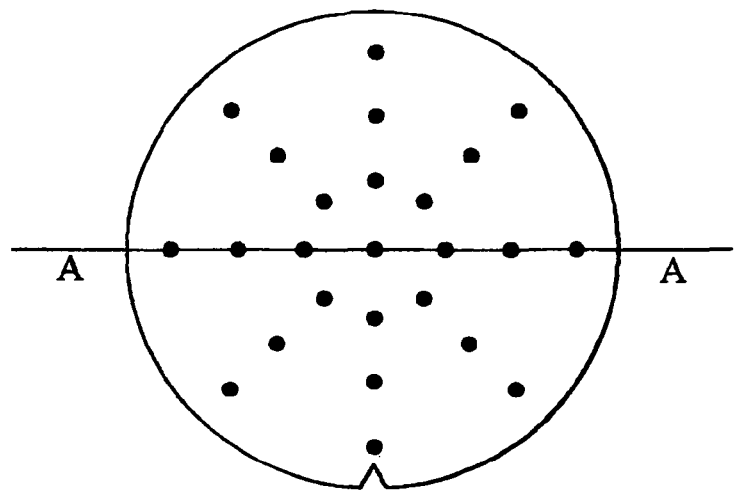
FIG. 4 is a plan view of a semiconductor wafer showing example coordinate positions to be registered for focal adjustment.

FIG. 4 is a plan view of the semiconductor wafer showing example coordinate positions to be registered for focal adjustment. Coordinate positions to be registered are determined so as to be distributed over the entire semiconductor wafer and not to be locally concentrated. It is possible that the user registers any desired location as a position to be registered, and that, when the user specifies the number of positions to be registered, coordinate positions of the specified number are automatically set as a position to be registered.

Returning to FIG. 3, the in-focus position analysis and calculation unit 26 determines whether or not there is a position to be registered at which focal adjustment is not completed (Step 103). When there is a position to be registered at which focal adjustment is not completed, the in-focus position analysis and calculation unit 26 moves the semiconductor wafer WF to enable focal adjustment at this position to be registered (Step 104), and repeats execution of Step 102 and Step 103.

When it is judged in Step 103 that there is no position to be registered at which focal adjustment is not completed, the in-focus position analysis and calculation unit 26 sets a focal correction curved surface based on the data at the obtained positions to be registered and the data at the in-focus position (Step 105). The focal correction curved surface is a curved surface on three-dimensional coordinate axes which are composed of two-dimensional coordinate axes in parallel with the semiconductor wafer surface and a one-dimensional coordinate axis perpendicular thereto. The coordinates of the positions to be registered are set on the two-dimensional coordinate axes, and the focal position is set on the one-dimensional axis. The focal correction curved surface is formed through function approximation based on the data at the positions to be registered and the data at the in-focus position. Function approximation is performed so that a difference between a measured value of the in-focus position and a function-based value is minimized at one position to be registered. This difference is defined as a deviation of the next step. In automatic focal adjustment of an actual defect, the focal position is corrected by use of the focal correction curved surface.

Figure 5:
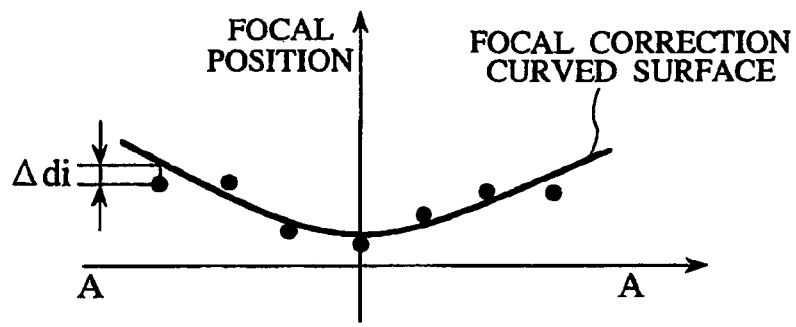
FIG. 5 is a diagram showing a relation between focal positions and a focal correction curved surface on a cross section taken along the A-A line of FIG. 4.

Then, the in-focus position analysis and calculation unit 26 calculates a deviation of the measured value of the focal position from the focal correction curved surface at the position to be registered (Step 106). FIG. 5 is a diagram showing a relation between focal positions and the focal correction curved surface on a cross section taken along the A-A line of FIG. 4 when the plan view of the semiconductor wafer shown in FIG. 4 is used as the two-dimensional coordinate axes. FIG. 5 shows from the values of the focal correction curved surface that the amount of focal correction becomes larger at positions more radially outward from the central portion of the semiconductor wafer. The deviation $\Delta di$ (i=1 to n) is defined and calculated for each of the positions to be registered, as shown in FIG. 5, where n denotes the number of a point at which the in-focus position is obtained.

Then, the in-focus position analysis and calculation unit 26 sets a focal probe range (Step 107). The focal probe range is used when a defect sent from the inspection device 3 is imaged. The focal probe range is a range between upper- and lower-limit focal positions used at the time of automatic focal adjustment of the electron beam EB in the coordinate of the defect. The smaller the focal probe range, the shorter becomes the focal adjustment time. The in-focus position analysis and calculation unit 26 sets the focal probe range based on the deviation $\Delta di$ calculated in Step 106.

When B denotes the focal probe range and Max ( ) denotes a maximum value of the values in ( ), B can be defined by the following formula.

$$B = 2 \times \text{Max}(|\Delta di|) \qquad \text{Formula 1}$$

Alternatively, in combination with the standard deviation of $\Delta di$, B can also be defined by the following formula.

$$B = 2 \times (k \times \sqrt{(\Sigma(\Delta di - \text{AVE}(\Delta d))^2/(n-1))} + \text{AVE}(\Delta d)) \qquad \text{Formula 2}$$

where AVE($\Delta di$) denotes the average of $\Delta di$, n denotes the number of defect positions to be registered, and k denotes a constant. The above formulas are merely examples and it is also possible to define a focal probe range by use of other formulas.

Figure 6:
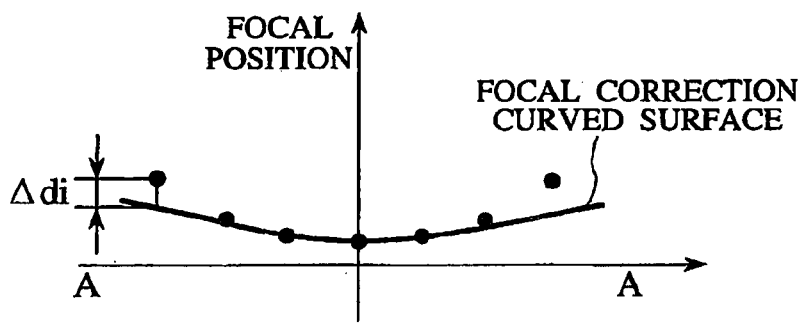
FIG. 6 is a diagram showing a relation between focal positions and the focal correction curved surface on the cross section taken along the A-A line of FIG. 4.
Figure 7:
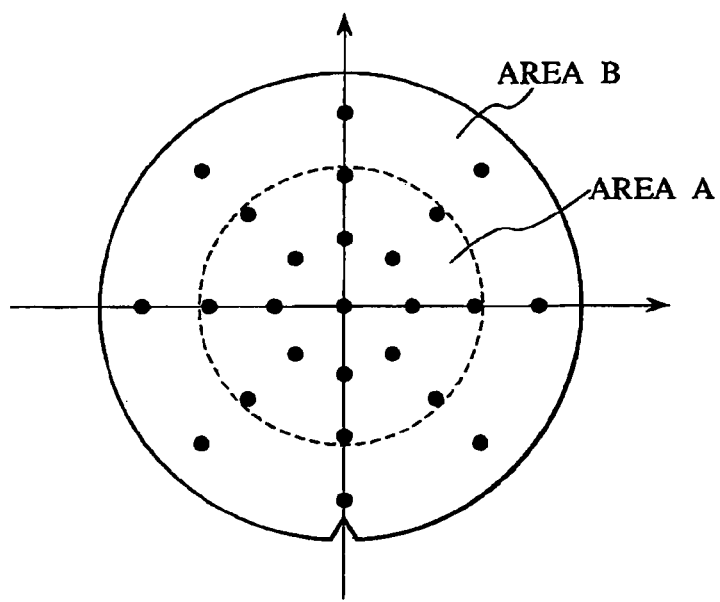
FIG. 7 is a plan view of a semiconductor wafer showing example coordinate positions to be registered for focal adjustment.

In order to set a focal probe range, it is also possible to split the inside of the semiconductor wafer surface into a plurality of areas and then set a formula for defining a focal probe range for each area. Similarly to FIG. 5, FIG. 6 is a diagram showing a relation between focal positions and the focal correction curved surface on the cross section taken along the A-A line of FIG. 4. FIG. 7 is a plan view of the semiconductor wafer showing example coordinate positions to be registered for focal adjustment. In a case where the deviation from the focal correction curved surface at the positions to be registered is small in an area in the vicinity of the central portion of the semiconductor wafer surface, and the deviation is larger in an area at positions more radially outward from the central portion, as shown in FIG. 6, it is also possible to split the semiconductor wafer surface concentrically into two areas (areas A and B) and set a focal probe range for each area, as shown in FIG. 7. In this case, the focal probe range of the area B is set so as to be larger than that of the area A.

FIG. 8 is a diagram showing an example screen for setting parameters for automatic focal adjustment displayed on the display unit 17 shown in FIG. 2. Characters "AF setup" indicating the setup screen for automatic focal adjustment are displayed at the top left of the screen. Characters "Range" indicating parameters for defining a focal probe range are displayed at the top of the screen display area, and characters "Mode" indicating parameters for changing the balance of the focal probe time and focal probe accuracy at the bottom of the screen display area.

As an example setup of "Range" which is a parameter for defining a focal probe range, an actual numerical value is almost meaningless. For example, setting three different levels "Narrow", "Wide", and "Normal" (intermediate value) will be convenient for use. A possible fixed value is preset as a focal probe range, and this value is set in the case of "Normal" (intermediate value). A fixed value smaller than the value of "Normal" (intermediate value) is preset, and this value is set in the case of "Narrow." A fixed value larger than the value of "Normal" (intermediate value) is preset, and this value is set in the case of "Wide." Further, "Auto" can be selected. When "Auto" is selected, a focal probe range is set based on the formulas for defining a focal probe range given as Formula 1 or 2.

As an example setup of "Mode" which is a parameter for changing the balance between the focal probe accuracy and the focal probe time, "Fine" giving priority on the focal probe accuracy, "Fast" giving priority on the focal probe time, or "Normal" (intermediate value) can be selected. The focal probe accuracy can be enhanced by narrowing a threshold range used to determine the in-focus state or increasing the limit of the number of automatic focal adjustments for each coordinate position. The focal probe time can be shortened by extending the threshold range used to determine the in-focus state or decreasing the limit of the number of automatic focal adjustments for each coordinate position.

As mentioned above, in accordance with an embodiment of the present invention, at the time of automatic focal adjustment for defect probing, focal positions are corrected on a focal correction curved surface created from focal positions at a plurality of pre-registered coordinate positions, and further a screen for easily setting a focal probe range is provided. Consequently, it becomes possible to provide a defect review method and a defect review device using an electron microscope that can reduce the number of user processes necessary for setting automatic focal adjustment of an electron beam to provide easier sample observation.

Although the above-mentioned embodiment uses an SEM as a magnified image pickup device for review, the magnified image pickup device may be an optical microscope based on visible radiation or a microscope based on ultraviolet radiation. Regardless of the type of energy used, the strength of energy, and the method for visualization, the same function and the same effect can be obtained by any apparatuses having a function to take magnified images of a defect.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A review method for detecting a defect on an object under observation, the method comprising steps of:

performing focal adjustment confirmed by scanning electron microscope (SEM) image for a plurality of coordinate positions pre-registered for the object under observation to determine an actual in-focus position at each of the plurality of coordinate positions;

creating a focal correction curved surface for focal adjustment based on the actual in-focus position at each of the plurality of coordinate positions;

setting a focal probe range for the object based on a maximum value of deviation between the focal correction curved surface and actual in-focus position; and determining an automatic focal adjustment range for defect detection on the object under observation based on the set focal probe range.

2. The review method according to claim 1, wherein:
the curved surface is represented by three-dimensional coordinate axes composed of two-dimensional coordinate axes with respect to a plane of the object under observation and a one-dimensional coordinate axis perpendicular to the plane, and
the coordinate position is set on the two-dimensional axes and the focal position on the one-dimensional axis.

3. A review apparatus for detecting a defect on an object under observation, the apparatus comprising:
an electron microscope to obtain an image of the defect, which is configured to perform automatic focal adjustment of the defect on the object under observation;
an in-focus position analysis and calculation unit for processing the following steps:
(a) determining an in-focus position for a plurality of coordinate positions on the object in the automatic focal adjustment,
(b) creating a focal correction curved surface based on the determined in-focus positions, and
(c) setting a focal probe range for the object based on the maximum value of deviation between the focal correction curved surface and actual in-focus position.

4. The review apparatus according to claim 3,
wherein the focal probe range is a preset fixed value.

5. The review method according to claim 1,
wherein the surface of the object is concentrically split in two areas, and the focal probe range is set separately in each of two areas.

6. The review apparatus according to claim 3,
wherein the surface of the object is concentrically split in two areas, and the focal probe range is set separately in each of two areas.

* * * * *